United States Patent
Mehio et al.

(10) Patent No.: US 8,873,682 B2
(45) Date of Patent: Oct. 28, 2014

(54) HYBRID AFC USING DCXO AND RF PLL

(71) Applicant: Broadcom Corporation, Irvine, CA (US)

(72) Inventors: Rami Mehio, San Diego, CA (US); Masoud Kahrizi, Irvine, CA (US); Cobus de Beer, San Diego, CA (US); Michael Buyanin, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 133 days.

(21) Appl. No.: 13/631,421

(22) Filed: Sep. 28, 2012

(65) Prior Publication Data

US 2014/0091842 A1    Apr. 3, 2014

(51) Int. Cl.
*H04L 27/06* (2006.01)

(52) U.S. Cl.
USPC .............. 375/344; 375/371; 331/1 R; 331/34; 331/36 C; 331/177 R; 331/40; 331/41

(58) Field of Classification Search
USPC ................. 375/327, 344, 371, 373, 375–376; 327/156, 159, 162; 331/1 R, 8, 34, 36 C, 331/40–41, 44, 46, 175, 177 R
See application file for complete search history.

(56) References Cited

U.S. PATENT DOCUMENTS

| | | | |
|---|---|---|---|
| 6,327,463 B1 | 12/2001 | Welland | |
| 7,593,482 B2 * | 9/2009 | Gong et al. | 375/316 |
| 8,164,688 B2 * | 4/2012 | Wu | 348/536 |
| 2004/0058653 A1 * | 3/2004 | Dent | 455/69 |
| 2004/0166815 A1 * | 8/2004 | Maligeorgos et al. | 455/73 |
| 2005/0141655 A1 * | 6/2005 | Lee et al. | 375/344 |
| 2006/0145767 A1 | 7/2006 | Vaananen | |
| 2006/0197620 A1 * | 9/2006 | Lee | 331/158 |
| 2007/0032213 A1 * | 2/2007 | Grieco et al. | 455/257 |
| 2007/0054629 A1 * | 3/2007 | Maligeorgos et al. | 455/88 |
| 2009/0141845 A1 * | 6/2009 | Ballantyne et al. | 375/376 |
| 2010/0069085 A1 * | 3/2010 | Hammes et al. | 455/456.1 |
| 2010/0073054 A1 * | 3/2010 | Bereza et al. | 327/159 |
| 2010/0075620 A1 * | 3/2010 | Subburaj et al. | 455/110 |
| 2010/0102894 A1 * | 4/2010 | Sun et al. | 331/1 A |
| 2012/0068742 A1 * | 3/2012 | Kuo et al. | 327/156 |
| 2012/0106685 A1 * | 5/2012 | Tsai et al. | 375/346 |
| 2012/0225629 A1 * | 9/2012 | Shi et al. | 455/182.2 |
| 2012/0313676 A1 * | 12/2012 | Nguyen et al. | 327/156 |
| 2012/0328058 A1 * | 12/2012 | Etemadi et al. | 375/344 |
| 2013/0043958 A1 * | 2/2013 | Chen et al. | 331/117 FE |
| 2013/0321048 A1 * | 12/2013 | He | 327/156 |

OTHER PUBLICATIONS

European Patent Office; European Search Report; EP Application No. 13003098.4; Dec. 10, 2013; 3 pgs.

* cited by examiner

*Primary Examiner* — Jean B Corrielus
(74) *Attorney, Agent, or Firm* — Garlick & Markison; Bruce E. Garlick (57) ABSTRACT

A technique to provide hybrid compensation to correct for drifts in a reference frequency output from a digitally-controlled crystal oscillator (DCXO). A first compensation is provided to the DCXO to adjust for overlap or discontinuity of the reference frequency caused by switching capacitors in the capacitor array that controls drift of the reference frequency output. The second compensation is obtained at a phase-locked loop (PLL) that receives the reference frequency signal from the DCXO. The second compensation adjusts the PLL to adjust for variations of the reference frequency that remain after performing compensation in the DCXO.

20 Claims, 10 Drawing Sheets

HYBRID AFC USING DCXO AND RF PLL

BACKGROUND OF THE INVENTION

1. Technical Field of the Invention

The embodiments of the invention relate to wireless communications and, more particularly, to frequency compensation of clocks and/or oscillators for a wireless mobile device.

2. Description of Related Art

Various wireless communication systems are known today to provide communication links between devices, whether directly or through a network. Such communication systems range from national and/or international cellular telephone systems, the Internet, point-to-point in-home systems, as well as other systems. Communication systems typically operate in accordance with one or more communication standards or protocols. For instance, wireless communication systems may operate using protocols, such as IEEE 802.11, Bluetooth™, advanced mobile phone services (AMPS), digital AMPS, global system for mobile communications (GSM), code division multiple access (CDMA), local multi-point distribution systems (LMDS), multi-channel-multi-point distribution systems (MMDS), as well as others.

Presently, in the mobile (e.g. cellular) telephone area, 3G ($3^{rd}$ Generation) mobile phones based on 3GPP ($3^{rd}$ Generation Partnership Project) technology utilize Evolved High Speed Packet Access (HSPA+) to obtain high data rates for downloads. HSPA+ allows data rates approaching 21 Mbps and, in some categories, may exceed 21 Mbps. The trend for mobile devices is to move toward Long Term Evolution (LTE) technology and 4G ($4^{th}$ Generation) technology to obtain much higher data rates.

For each wireless mobile communication device, such as a mobile phone, to participate in wireless communications, it generally includes a built-in radio transceiver (e.g., receiver and transmitter) or is coupled to an associated radio transceiver. Typically, the transceiver (or radio) includes a baseband processing stage and a radio frequency (RF) stage. The baseband processing provides the conversion from data to baseband signals for transmitting and baseband signals to data for receiving, in accordance with a particular wireless communication protocol. The baseband processing stage is coupled to a RF stage (transmitter section and receiver section) that provides the conversion between the baseband signals and RF signals. The RF stage may be a direct conversion transceiver that converts directly between baseband and RF or may include one or more intermediate frequency stage(s). For handheld devices, where most or all of the components are resident in the device, the handheld device typically also includes an application processor or processors to execute various applications for the device.

The radio portion of the handheld device, such as a mobile phone, uses a crystal oscillator to generate accurate clock signals at a reference frequency. In one instance, the crystal oscillator generates clock signals to further produce local oscillator output for use in signal conversion in the receiver and/or the transmitter. However, a drift in frequency causes a number of problems in a mobile (e.g. cellular) phone, such as carrier frequency synchronization and time synchronization. For example, a frequency drift of the crystal oscillator may cause a variation in the sampling time, so that the data is not sampled at the correct moment. Incorrect sampling can increase the bit error rate (BER) and reduce the throughput of the system. This impairment is more pronounced for higher data rate applications, such as HSPA+. To avoid the drift in the output frequency, mobile phones use some mechanisms to adjust the reference frequency generated by the crystal oscillator. In the past, the capability to maintain the target oscillation frequency was provided by a voltage-controlled, temperature-compensated, crystal oscillator (VC-TCXO). Low cost and smaller handsets now employ transceivers with fully integrated digitally-controlled crystal oscillators (DCXOs) at the clock interface. DCXOs use a low cost crystal and an array of capacitors to adjust the reference frequency.

DCXOs typically contain two arrays of capacitors. The first array of capacitors is used to provide coarse adjustment to compensate for static error due to process variations. The second array of capacitors is used to provide very fine tuning capability to compensate for any dynamic error, such as temperature drift, pushing or pulling impacts. For mobile phones utilizing low data rates, some amount of frequency drift is acceptable. However, for higher data rate phones, such as phones with HSPA+ capability or higher, drift of the reference frequency of even in a few Hertz may have substantial consequences. Achieving a few Hz of resolution within the full range of the capacitor arrays is difficult to obtain and, in some instances, could be limited by the accuracy of the fabrication process. Accordingly, these limitations and process variations may degrade the resolution of the DCXO and cause a significant frequency gap in a tuning curve of a DCXO. Any frequency gap could result in signal loss for a mobile phone, if the phone is operating or attempting to operate at a frequency that crosses the gap.

Accordingly, there is a need for a reference component, such as a DCXO, to be compensated for dynamic and static errors, as well as continuously adjusting the frequency to prevent the occurrence of frequency gaps, while maintaining overall reference frequency error resolution to be in the range of a few Hertz.

DETAILED DESCRIPTION OF THE INVENTION

The embodiments of the present invention may be practiced in a variety of wireless communication devices that operate in a wireless environment or network. The examples described herein pertain to devices that operate as a mobile phone. However, the practice of the invention need not be limited to phones only and can be adapted to other wireless communication devices. Likewise, the particular device for generating the reference frequency is a digitally-controlled (or digitally-compensated) crystal oscillator (DCXO). However, the invention is applicable to other oscillators as well that use switching circuitry or components that generate the reference frequency. Furthermore, a radio frequency (RF) Phase-Locked Loop (PLL) is compensated and used herein to generate the local oscillator signal, which frequency is based on the reference frequency from the DCXO. However, other embodiments of the invention may use various other circuitry to generate the local oscillation for RF signal conversion.

Figure 1:
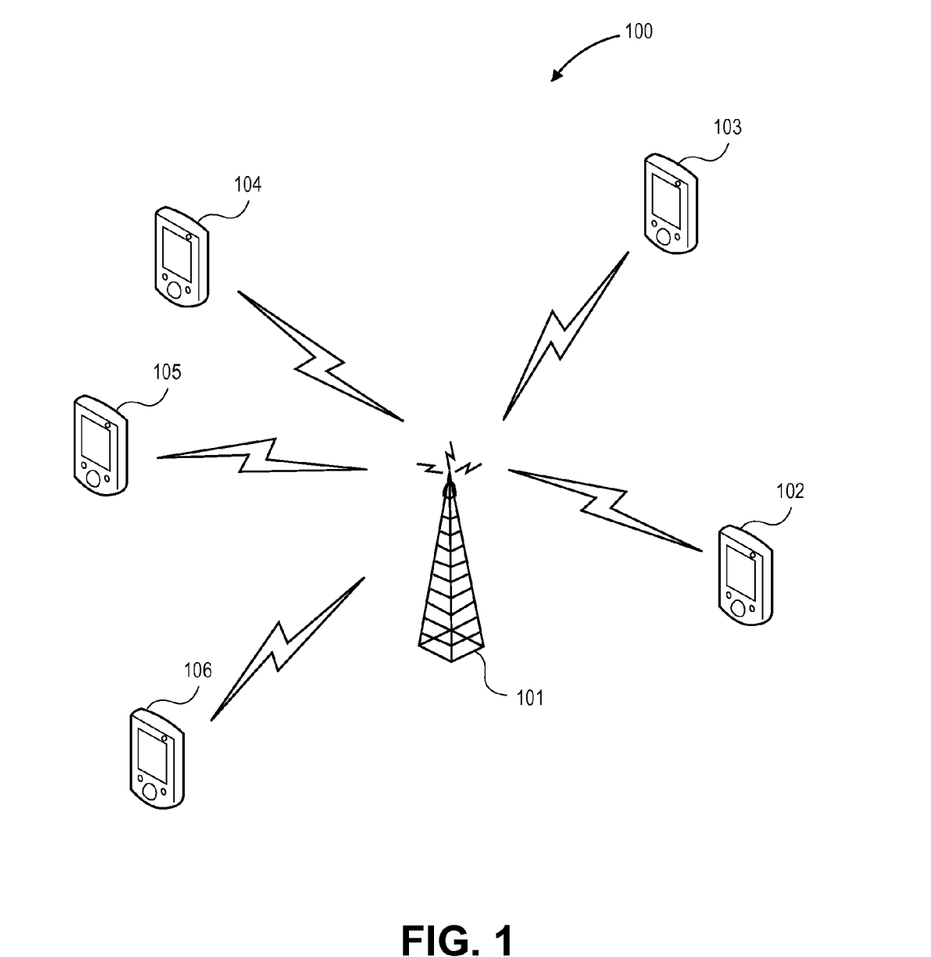
FIG. 1 is a diagram of a network in which multiple mobile phones are present in the network, wherein one or more phones in the network operate in accordance with one embodiment for practicing the invention.

FIG. 1 shows a wireless network 100, which may be any type of wireless network. In one embodiment, network 100 is a mobile telephone network that operates using 3G or 4G LTE to communicate with a plurality of devices 102-106. Devices 102-106 are mobile phones, commonly referred to as cellular phones, smartphones, etc. However, devices 102-106 may be other than phones, such as tablet computers or handheld multimedia devices that communicate using network 100. A control point or node 101 communicates with phones 102-106. Node 101 is commonly referred to as NodeB (NB) or Evolved NodeB (eNodeB or eNB). However, other nodes and control points may be used in other networks. In one instance, network 100 is a 3G network with HSPA+ capability, in which data is downloaded to the devices 102-106 at a higher data rate approaching 21 Mbps. In other instances, network 100 may have higher data rates than 21 Mbps. As an example, network 100 may be a 4G LTE network. One or more of the devices 102-106 include(s) the hybrid compensation technique of the present invention to provide minimal drift of the reference frequency. It is to be noted that although only 5 phones are shown in FIG. 1, other networks may have fewer or more phones operating within the network.

Figure 2:
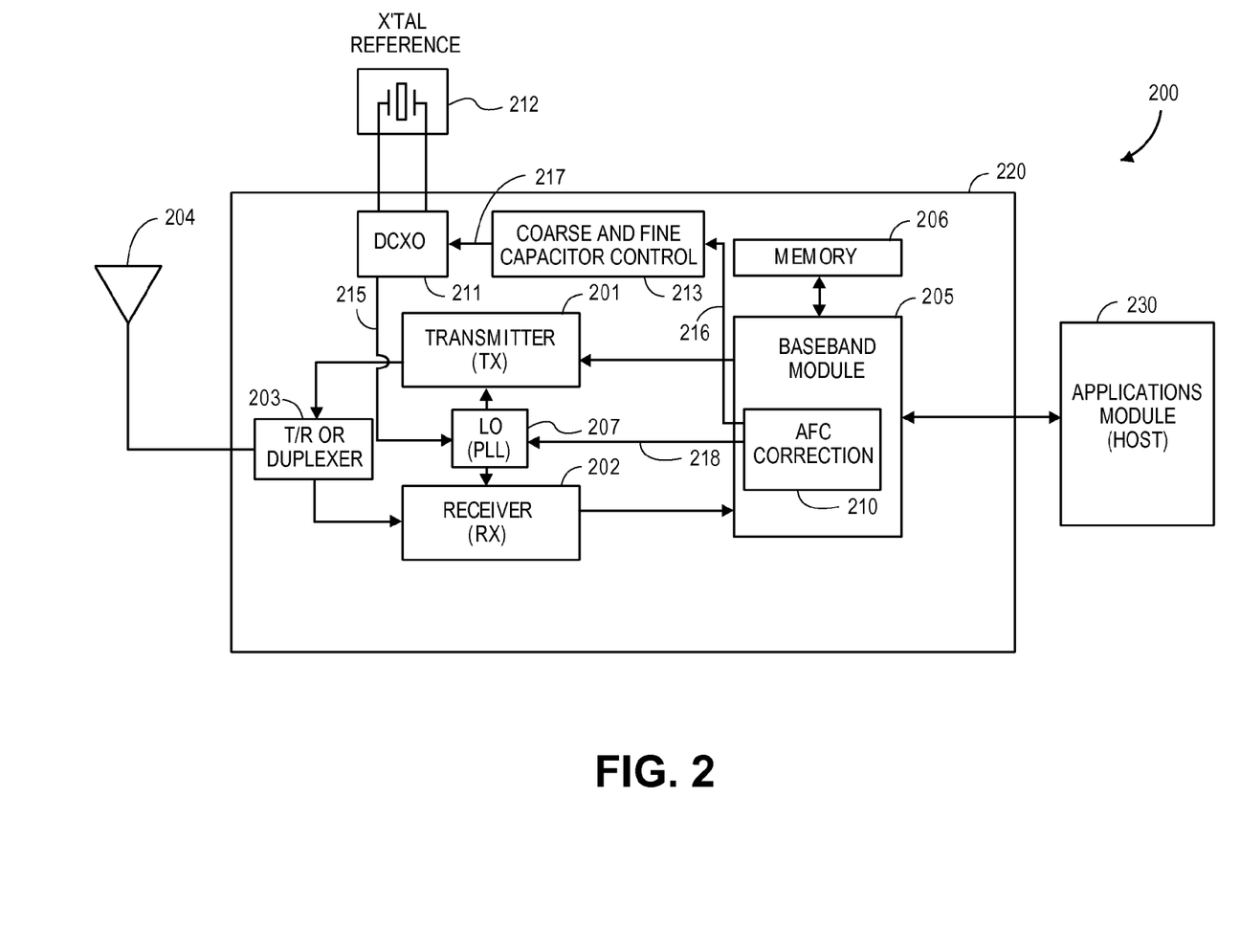
FIG. 2 is a hardware schematic block diagram showing a wireless communication device that incorporates a DCXO, in which a hybrid automatic frequency control that operates in accordance with one embodiment for practicing the invention is used to control the drift of the reference frequency.

FIG. 2 is a schematic block diagram illustrating part of a wireless communication device 200 that includes a radio 220 and applications module 230. Radio 220 includes a transmitter (TX) 201, receiver (RX) 202, local oscillator (LO) 207 and baseband module 205. Baseband module 205 includes a processor to provide baseband processing operations. In some embodiments, baseband module 205 is or includes a digital-signal-processor (DSP). Baseband module 205 is typically coupled to a host unit, applications processor or other unit(s) that provides operational processing for the device and/or interface with a user.

In the example of FIG. 2, applications module 230 may be an application processor in one instance or it may be a host unit in another instance. For example, in a computing device, applications module (or host) 230 may represent the computing portion of the computer, while radio 220 is utilized to provide the radio components for radio frequency (RF) transmission and reception. Similarly, for a handheld device, applications module 230 may represent the application portion of the handheld device, while radio 220 is utilized for RF communication with NodeB or some other device. In a mobile phone, applications module 230 includes one or more processors to provide various applications for the mobile phone, while radio 220 provides the RF communications to communicate with NodeB. Furthermore, radio 220, as well as applications module 230, may be incorporated in one or more integrated circuits.

A memory 206 is shown coupled to baseband module 205, which memory 206 may be utilized to store data, as well as program instructions that operate on baseband module 205. Various types of memory devices may be utilized for memory 206. In one embodiment, memory 206 may store values or a table associated with the hybrid frequency compensation technique described below. It is to be noted that memory 206 may be located anywhere within device 200 and, in one instance, it may also be part of baseband module 205 and/or applications module 230.

Transmitter 201 and receiver 202 are coupled to an antenna (or antenna assembly) 204 via transmit/receive (T/R) switch module 203. Transmitter 201 and receiver 202 may be coupled to the antenna by a duplexer. It is to be noted that T/R switch module may comprise a switch, power combiner, power splitter, duplexer, digital processing circuit, as well as other devices. In some instances, a T/R switch module is not used. T/R switch module 203 switches the antenna between the transmitter and receiver depending on the mode of operation. In other embodiments, separate antennas may be used for transmitter 201 and receiver 202, respectively. Furthermore, in other embodiments, multiple antennas or antenna arrays may be utilized with device 200 to provide antenna diversity or multiple input and/or multiple output, such as MIMO, capabilities.

Outbound data for transmission from applications module 230 are coupled to baseband module 205 and converted to baseband signals and then coupled to transmitter 201. Transmitter 201 converts the baseband signals to outbound radio frequency (RF) signals for transmission via antenna 204. Transmitter 201 may utilize one of a variety of up-conversion or modulation techniques to convert the outbound baseband signals to outbound RF signal. Generally, the conversion process is dependent on the particular communication standard or protocol being utilized, such as 3G or LTE.

In a similar manner, inbound RF signals are received by antenna assembly 204 and coupled to receiver 202. Receiver 202 then converts the inbound RF signals to inbound baseband signals, which are then coupled to baseband module 205. Receiver 202 may utilize one of a variety of down-conversion or demodulation techniques to convert the inbound RF signals to inbound baseband signals. The inbound baseband signals are processed by baseband module 205 and inbound data is output from baseband module 205 to applications module 230. Baseband module 205 generally operates by utilizing one or more communication protocols for transmitting and receiving, such as 3G or LTE.

LO 207 provides local oscillation signals for use by transmitter 201 for up-conversion and by receiver 202 for down-conversion. In some embodiments, separate LOs may be used for transmitter 201 and receiver 202. Although a variety of LO circuitry may be used, in some embodiments, a PLL is utilized to lock the LO to output a frequency stable signal based on a selected channel frequency. In one embodiment for practicing the invention, LO 207 uses a PLL. As described below, a DCXO is used in one embodiment to provide the reference frequency to LO 207.

Radio 220 also includes DCXO 211, coarse and fine capacitor control (CAP control) module 213 and AFC (Automatic Frequency Control or Compensation) module 210. AFC module 210 is shown as part of baseband module 205 in the shown embodiment, but AFC correction module 210 may reside elsewhere in other embodiments. DCXO 211 is typically coupled to a crystal (X'TAL) reference source 212, which provides a steady reference signal at a fixed frequency. As will be described herein, AFC correction module 210 provides a compensated control signal (whether a control word or a signal) 216 to CAP control module 213 to provide a control signal 217, in way of DAC values, to DCXO 211 to select appropriate capacitors to tune DCXO 211. In typical DCXO operation, capacitors within DCXO 211 are used in a resonance circuit of DCXO 211, so that the capacitance value selected adjusts the frequency of DCXO reference signal 215 sent to LO 207. Accordingly, when baseband module 205 determines a channel frequency for communicating within a network (such as network 100 of FIG. 1), baseband module 205 selects the channel frequency of operation. As will be described below, AFC correction module 210 provides compensation for operating the radio at a steady reference frequency, by sending a compensation signal 216 to CAP control module 213 and a compensation signal 218 to LO 207. In some embodiments, the two compensation signals 216, 218 may be the same signal. In other embodiments, the two signals 216, 218 may be different signals. The hybrid AFC technique applies both compensations, one at the DCXO and one at the RF PLL, to compensate for reference signal drift in accordance with one embodiment for practicing the invention.

Figure 3A:
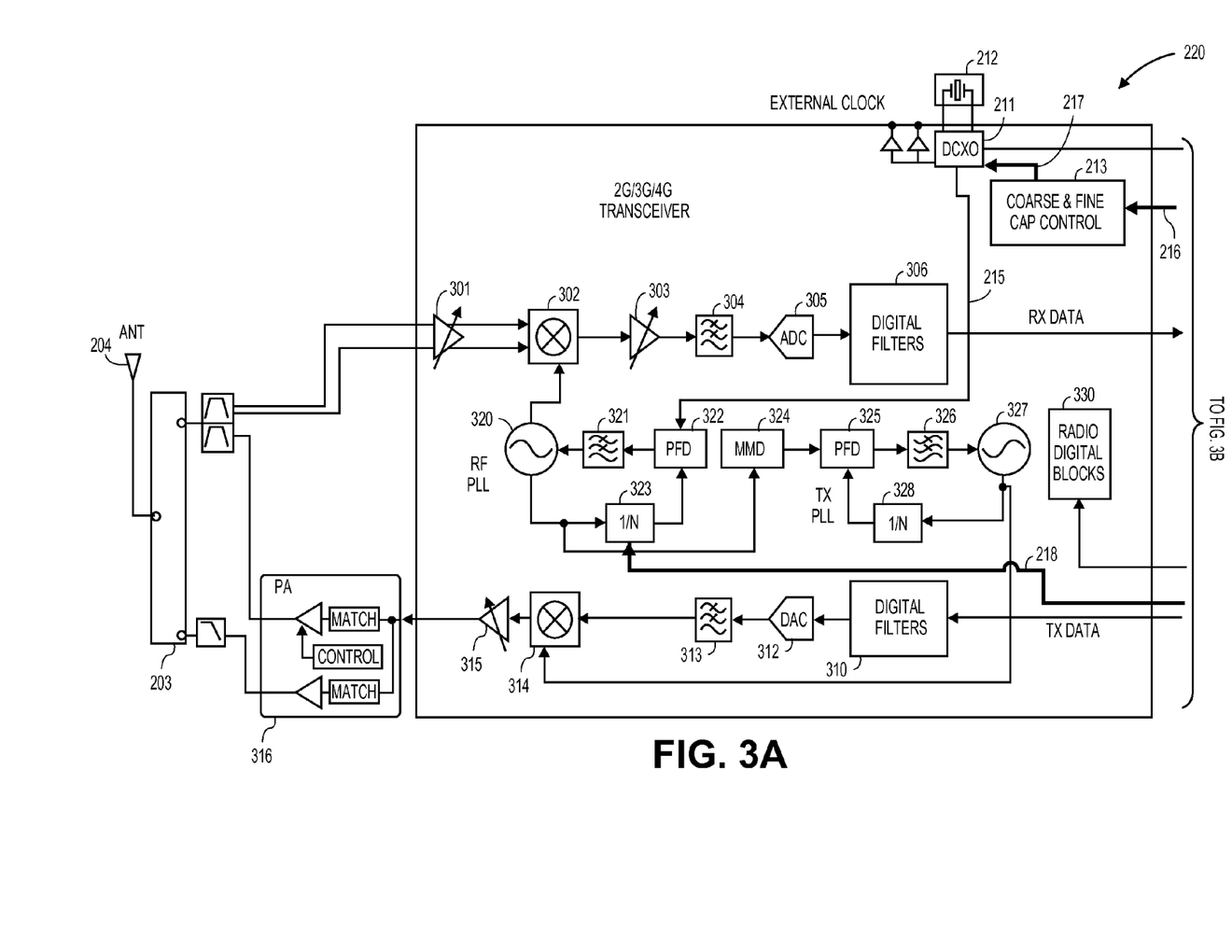
FIGS. 3A and 3B show a more detailed hardware schematic block diagram of a wireless communication device that incorporates a DCXO, in which a hybrid automatic frequency control that operates in accordance with one embodiment for practicing the invention is used to control the drift of the reference frequency in both the digital and analog domain.
Figure 3B:
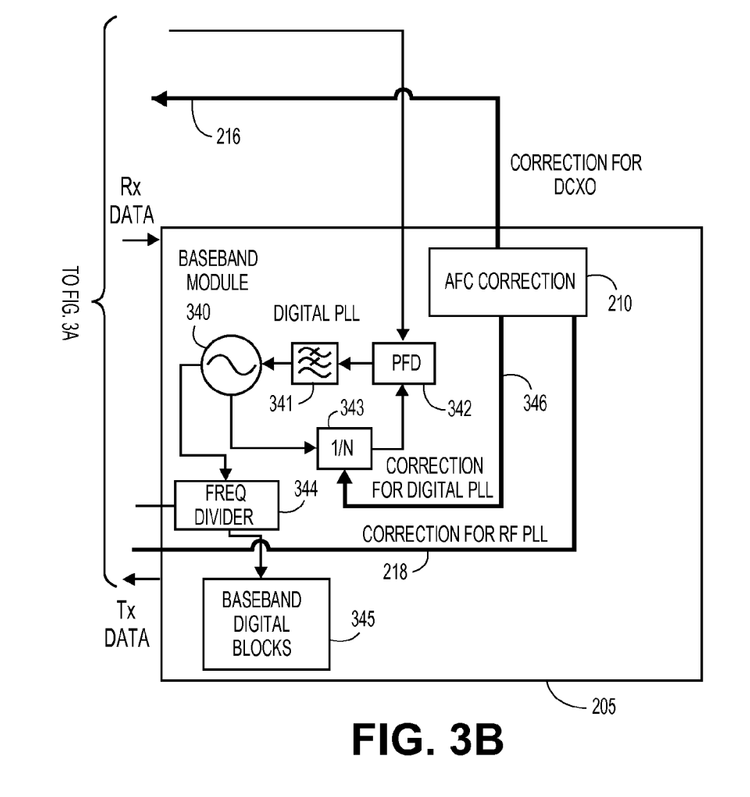

FIGS. 3A and 3B (hereinafter simply referred to as FIG. 3) show a more detailed equivalent circuitry for radio 220 of FIG. 2, in which baseband module 205 is shown in FIG. 3B and the RF portion (typically referred to as transceiver or RF front end) is shown in FIG. 3A. In FIG. 3, a receive chain of receiver 202 is represented by low noise amplifier (LNA) 301, mixer 302, variable gain amplifier 303, filter 304, analog-to-digital converter (ADC) 305 and digital filters 306, at which output, the RX data is coupled to baseband module (or baseband processor) 205. A transmit chain of transmitter 201 is represented by digital filters 310 (which receives data from baseband module 205), digital-to-analog converter (DAC) 312, filter 313, mixer 314, variable gain amplifier 315 and power amplifier (PA) 316. The output of PA 316 is coupled to switch 203 through a low pass filter for 2G or through a duplexer in case of 3G and LTE.

LO 207 is comprised of two PLL loops, one for the receiver and one for the transmitter. The receiver PLL is comprised of phase-frequency detector (PFD) 322, loop filter 321, oscillator 320 (which operates as the receiver local oscillator) and a 1/N divider 323 in the feedback loop of the receiver PLL circuit. The DCXO reference signal 215 is coupled to PFD 322. Aside from coupling the output as feedback to divider 323, the output of oscillator 320 is coupled to mixer 320 for RF conversion at the selected channel frequency. The output of oscillator 323 is also coupled to multiplier/divider (MMD) unit 324.

The transmitter PLL is comprised of PFD 325, loop filter 326, oscillator 327 (which operates as the transmitter local oscillator) and 1/N divider 328 in its feedback loop. In this embodiment, the output of oscillator 320 is coupled to MMD unit 324 to frequency divide the receiver LO signal as input to PFD 325. The output of oscillator 327 is coupled to transmitter mixer 314 as well as feedback to divider 328.

Note that the reference for the transmitter PLL frequency is determined by the output of the receiver oscillator 320. In other embodiments, the transmitter PLL may be a separate circuit and its reference set by DCXO reference signal 215. However, that would entail separate compensation of the RX and TX PLL. The shown embodiment of FIG. 3 permits the DCXO reference signal 215 to operate on the RX PLL and the compensated output of the RX PLL is used as the reference for the TX PLL. Thus, only one compensation is needed in the RF PLL stage for both RX and TX PLLs.

The compensation provided to DCXO 211 and the compensation provided to the RF PLL stage are shown by bold lines (compensation signals 216, 218) in FIG. 3 and described in reference to the following Figures. It is appreciated that an operation of a typical PLL circuitry is known in the art.

Baseband module 205 also utilizes a PLL stage to control the digital clock. Digital PLL is comprised of PFD 342 (which receives the DCXO reference signal as well), loop filter 341, oscillator 340 and 1/N divider 343 in the feedback loop. The output of oscillator 340 is coupled to a frequency divider (or divider/multiplier) 344 to generate digital clocks to baseband digital blocks (e.g. circuitry) 345 and digital clocks to radio digital blocks 330. AFC correction module 210 (shown residing as part of baseband module 205 in this embodiment) provides a compensation signal 346 (bold line) to the digital PLL.

Figure 4:
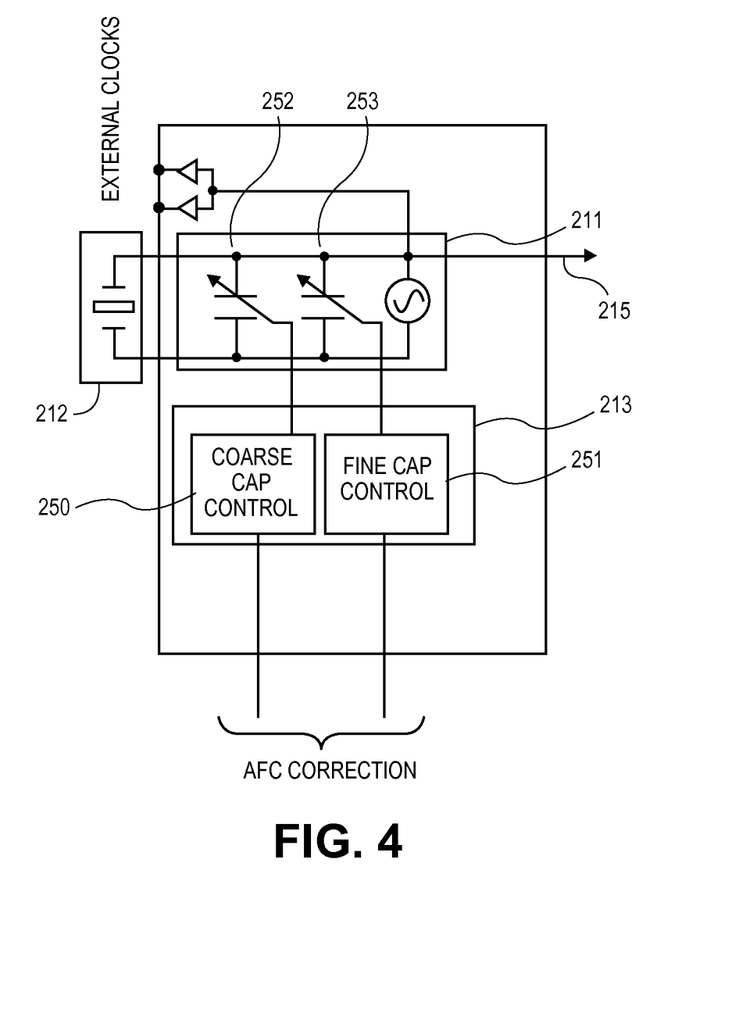
FIG. 4 shows a circuit schematic diagram for providing coarse and fine adjustment controls for the capacitor arrays that determine the reference frequency from the DCXO in accordance with one embodiment for practicing the invention.

FIG. 4 shows a more detailed diagram for CAP control module 213 and DCXO 211. As shown, DCXO 211 includes a capacitor array (shown as a variable capacitor) 252 to provide coarse tuning of DCXO 211 and a capacitor array 253 (also shown as a variable capacitor) to provide fine tuning of DCXO 211. A coarse capacitor control circuit 250 controls the selection of the capacitance value for array 252 and a fine capacitor control circuit 251 controls the selection of the capacitance value for array 253. In one embodiment, an AFC correction control word is sent as compensation signal 216 from AFC correction module 210. The capacitor control circuits control the frequency output from DCXO 211 by selecting the capacitance value that adjusts the output frequency of DCXO 211. In one embodiment, capacitors in the coarse array 252 and capacitors in the fine array 253 are switched in and out to adjust the frequency of the DCXO 211.

Typically, the two capacitor arrays 252, 253 respond by initially setting a coarse value and capacitors of the fine array are switched in (or out) for incremental fine changes. However, when the fine tuning adjustments run their course, the fine tuning capacitors are reset and the next coarse adjustment is made. This is synonymous with making incremental bit changes at the least significant bit level (fine adjustment) until the bits are reset and the most significant bit (coarse adjustment) is incremented to start the sequence of least significant bit (lsb) adjustment. Actually, in one embodiment, a control word from AFC correction module 210 are utilized to set DAC values for DACs in the coarse capacitor control 250 and fine capacitor control 251. The DACs are utilized to switch in and switch out the various capacitors in the two arrays 252, 253.

Figure 5:
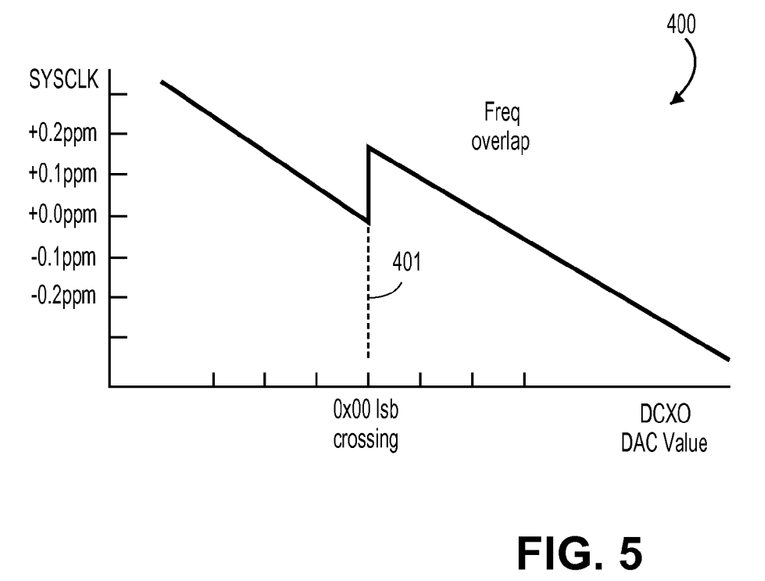
FIG. 5 shows an example diagram of a positive step frequency overlap of the reference frequency that results with the operation of a capacitor array in a DCXO.

FIG. 5 illustrates a situation when such a coarse adjustment occurs in the switching of the capacitors for DCXO 211. Diagram 400 shows a portion of the reference clock versus the DCXO DAC value that sets the frequency. The reference frequency is shown as a variance (in parts-per-million, or ppm, off the reference system clock). For example, in one embodiment, the crystal reference frequency (SYSCLK) is 26 MHz and the capacitor arrays 252, 253 vary the frequency, when the DCXO reference frequency drifts from 26 MHz due to variations in static and/or dynamic conditions. At crossing point 401 where the coarse adjustment is made (noted as 0x00 lsb crossing), a significant change in the frequency output occurs. This is typically the result of not having ideal matching at the junction where fine tuning for a range is at an end and the next coarse adjustment is switched in. This abrupt transition may take a positive step (as shown in FIG. 5) or it may take a negative step, as shown at transition point 411 for diagram 410 in FIG. 6.

Figure 6:
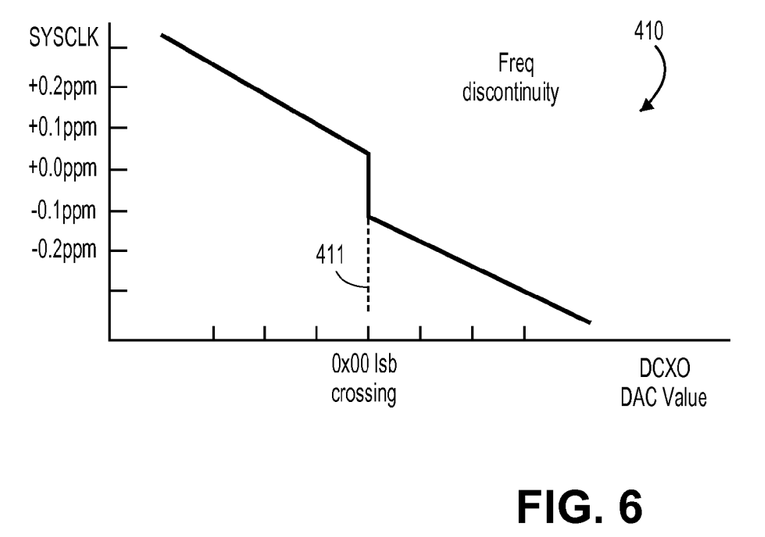
FIG. 6 shows an example diagram of a negative step frequency discontinuity of the reference frequency that results with the operation of the capacitor array in a DCXO.

Although the transition is of diagram 400 may be abrupt, the positive step is a frequency overlap, meaning that the portion of the curve past point 401 repeats some of the frequency achieved prior to point 401. Thus, some frequencies are repeated and could cause difficulty in reference frequency adjustment, since more than one DAC value could represent the same frequency. However, the negative step of diagram 410 may result in lost frequencies, because there is a frequency discontinuity at point 411. This frequency discontinuity at point 411 may cause the phone to increase its bit error rate (BER) or block error rate (BLER), lack some channels, or lose those channels during operation, if the reference frequency adjustment selected resides at or near the transition point 411. The overlap and discontinuity conditions may also affect the sampling, as noted in the Background section.

It is to be noted that the relationship between DAC values and adjustment to the reference frequency may be determined for a DCXO. This may be done at the manufacturing level when diagnostics may be run on the integrated circuit containing the DCXO. The testing or evaluation may also be done at a later time. In any event, through testing and analysis, a frequency response curve may be developed for a particular DCXO. Thus, a response curve, such as those shown in FIGS. 5 and 6 may be obtained to determine the reference frequency variation across various DAC values.

Figure 7:
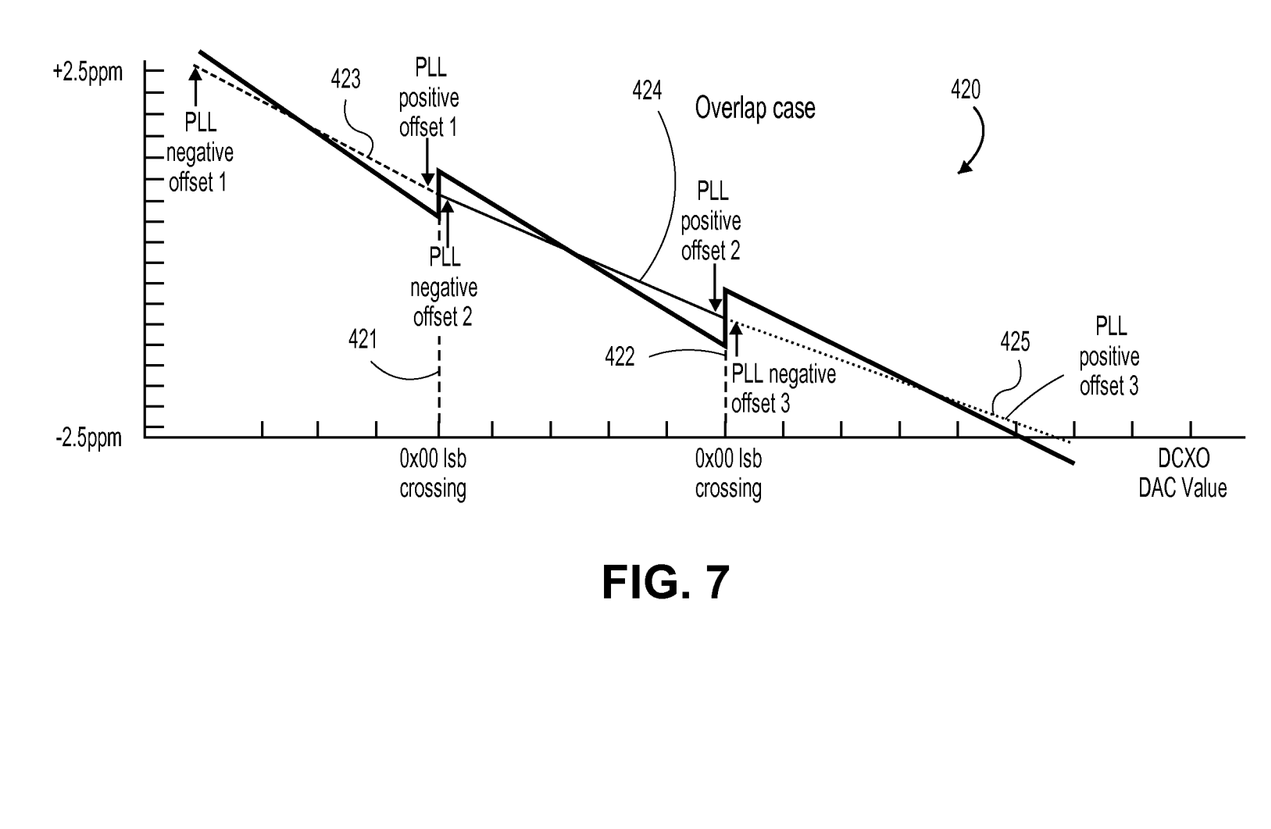
FIG. 7 shows an example diagram of providing hybrid frequency compensation to the positive step frequency overlap of the reference frequency in accordance with one embodiment for practicing the invention.
Figure 8:
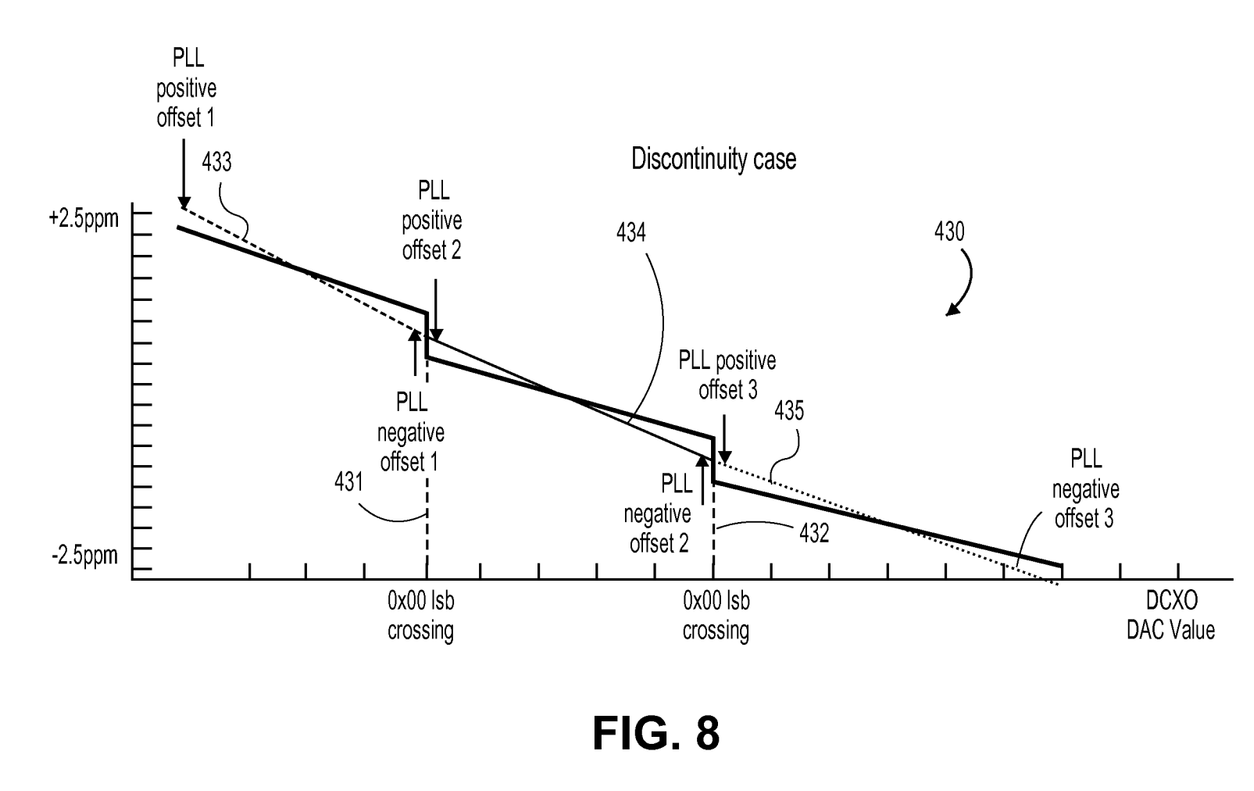
FIG. 8 shows an example diagram of providing hybrid frequency compensation to the negative step frequency discontinuity of the reference frequency in accordance with one embodiment for practicing the invention.

In order to account for the frequency overlap and discontinuity caused by the capacitor switching described above, an embodiment of the invention compensates the DAC values sent to and used by DCXO 211. FIG. 7 shows a diagram 420 for providing DCXO compensation for the overlap case and FIG. 8 shows diagram 430 for providing PLL compensation for the discontinuity case. The frequency adjustment is associated with an AFC tuning code in FIGS. 7 and 8, that corresponds to the earlier described DAC values. That is, a control word that provides coding is generated by AFC correction module 210.

In FIG. 7, diagram 420 shows two transition point 421 and 422 at the 0x00 lsb crossings. It is to be noted that a DCXO response curve may have more such transition points, depending on the nature of the capacitor arrays used. At each transition point (such as point 421, 422) where the overlap is present, a location approximately mid-way on the overlap portion is selected. This is done at each transition. A line is drawn connecting the mid-way locations, as exemplified by lines 423, 424, 425. Generally, the lines intersect the response curve, so that there is a negative offset portion and a positive offset portion in each segment (between the transition points). The resulting sequence of lines 423, 424, 425 provides a more linear transition across the DAC values as compared to the original DCXO curve. According, the DAC values are then correlated to the DCXO frequency so that the DCXO response curve now follows the segment lines 423, 424, 425, if the DCXO exhibits the overlap condition.

Likewise, diagram 430 shows two transition point 431 and 432 at the 0x00 lsb crossings. It is to be noted that a DCXO response curve may have more such transition points, depending on the nature of the capacitor arrays used. At each transition point (such as point 431, 432) where the discontinuity is present, a location approximately mid-way on the discontinuity portion is selected. This is done at each transition. A line is drawn connecting the mid-way locations, as exemplified by lines 433, 434, 435. Generally, the lines intersect the response curve, so that there is a positive offset portion and a negative offset portion in each segment (between the transition points). The resulting sequence of lines 433, 434, 435 provides a more linear transition across the DAC values as compared to the original DCXO curve. According, the DAC values are then correlated to the DCXO frequency so that the DCXO response curve now follows the segment lines 433, 434, 435, if the DCXO exhibits the discontinuity condition.

Note that during testing, a particular integrated circuit having a DCXO resident thereon may be analyzed to determine if it exhibits an overlap condition, discontinuity condition, or a combination of both. Then, a smoother curve may be determined by having offsets determined for segments of the curve between the overlap and/or discontinuity locations. The original DAC values may then be adjusted by corresponding offset values and stored as the compensated values for selecting the capacitors to adjust the DCXO reference signal output.

Figure 9:
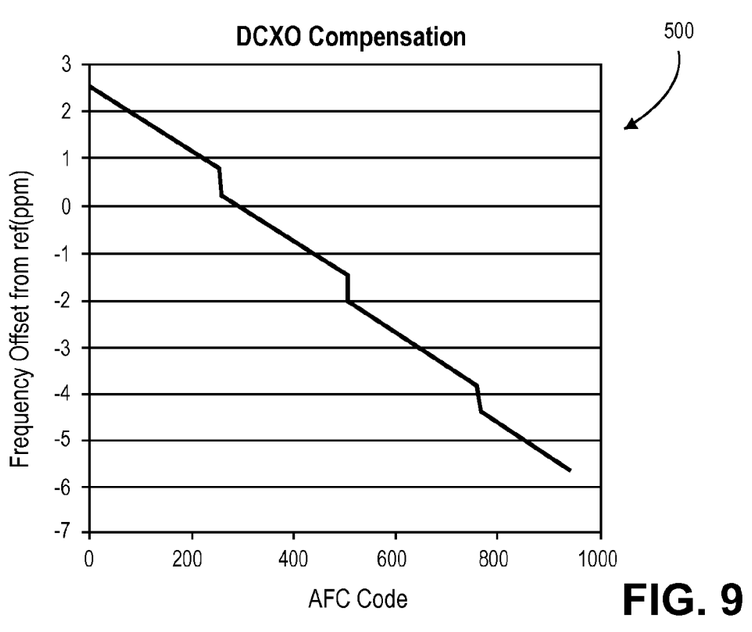
FIG. 9 shows an example frequency compensation provided for the negative step frequency discontinuity at the DCXO in accordance with one embodiment for practicing the invention.

Accordingly, FIG. 9 shows a compensated DCXO frequency response that is smoother than without the compensation (e.g. FIGS. 5 and 6). However, there is still some overlap or discontinuity that remains, since the capacitor typically cannot be controlled to such a fine level to remove all offset at the transition points. Graph of curve 500 shows the residual discontinuity for a compensated DCXO.

Figure 10:
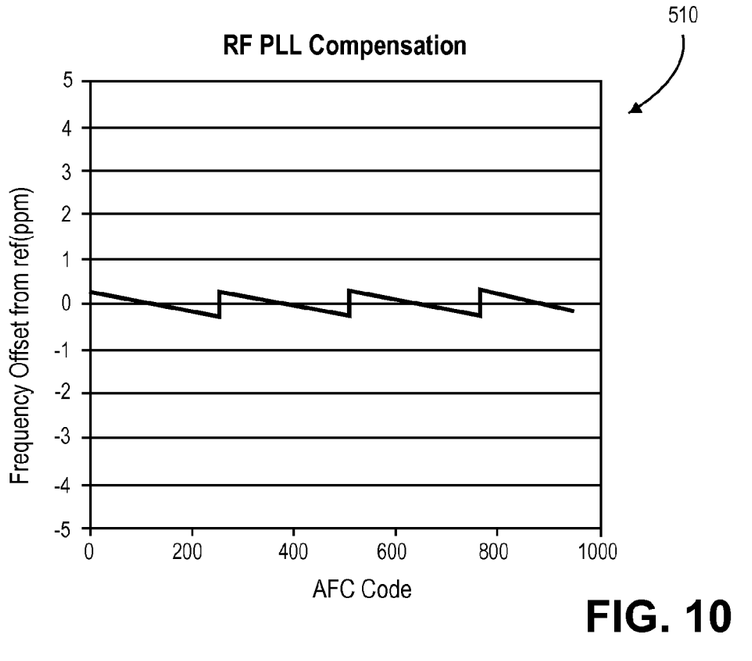
FIG. 10 shows an example frequency compensation provided for the negative step frequency discontinuity at the RF PLL in accordance with one embodiment for practicing the invention.
Figure 11:
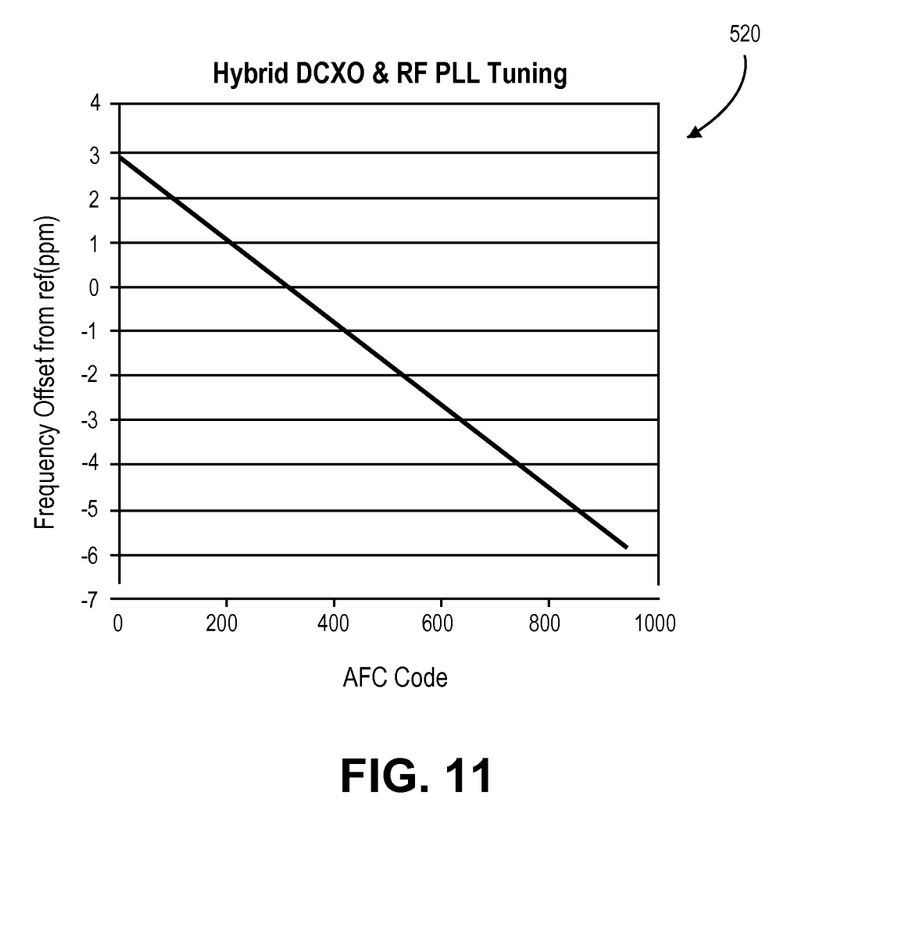
FIG. 11 shows an example result that is obtained when combining the frequency compensations provided at both the DCXO and the RF PLL in accordance with one embodiment for practicing the invention.

In order to further compensate for this residual overlap or discontinuity, a second compensation is applied, but this time to the RF PLL. As shown in FIG. 3, this second compensation is provided to divider 323 in the RX PLL loop. The adjustment is applied to vary the divider value in the PLL feedback loop to provide the PLL compensation. Once the DCXO compensated response is determined (e.g. again by testing) as shown in the example of FIG. 9, the PLL feedback is adjusted for the transition points of curve 500. This PLL compensation is illustrated as curve 510 in FIG. 10. When the two curves 500, 510 are combined, the final result is shown as curve 520 in FIG. 11. Note that any overlap or discontinuity is essentially removed, or at least significantly reduced. Now there is a smoother one-to-one relationship between the DAC values and the DCXO frequency.

This compensated correlation is stored, such as in memory 206, and provided by the AFC correction module 210 to compensate for reference frequency drift as conditions change. Because the two compensation signals are generated at the same source (e.g. AFC correction module), there is no error between the two compensating signals. Furthermore, the same technique may be applied to the digital PLL, where the DCXO compensated signal is coupled to PFD 342 and digital PLL compensation provided by signal 340.

Thus, a hybrid technique of compensating both the DCXO and a PLL (RF and/or digital) is described, in which reference frequency adjustments may be made more reliable and smoothly over uncompensated DCXOs to adjust for reference frequency drift. The technique is hybrid in that one compensation is applied to the tuning of the DCXO, while the second compensation adjusts the PLL that uses the reference frequency from the DCXO. With the hybrid arrangement described, requirements placed on the baseband or the RF PLL is very relaxed, since the frequency range covered may be limited by plus/minus maximum possible overlap or discontinuity. Therefore, the hybrid arrangement may be made much simpler to implement than free running crystal oscillators where the DCXO may be fixed, while providing resolutions down to few Hertz or even down to 1 Hertz, in some instances.

Furthermore, although the disclosure is described based on a mobile phone, embodiments of the invention may be readily implemented in other devices, including other wireless communication devices.

The embodiments of the present invention have been described above with the aid of functional building blocks illustrating the performance of certain functions. The boundaries of these functional building blocks have been arbitrarily defined for convenience of description. Alternate boundaries could be defined as long as the certain functions are appropriately performed. One of ordinary skill in the art may also recognize that the functional building blocks, and other illustrative blocks, modules and components herein, may be implemented as illustrated or by discrete components, application specific integrated circuits, processors executing appropriate software and the like or any combination thereof.

As may also be used herein, the terms "processing module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information.

We claim:

1. An apparatus comprising:
a digitally-controlled oscillator (DCXO) to generate a reference frequency signal, the DCXO including a capacitor array configured to adjust the reference frequency signal by switching in and out capacitors of the capacitor array to compensate for drift in the reference frequency signal;
a local oscillator coupled to receive the reference frequency signal and to provide an output signal based on the reference frequency signal; and
a frequency correction module, coupled to the DCXO and to the local oscillator, to provide a first compensation signal to control the capacitor array and to provide a second compensation signal to the local oscillator to adjust for variations of the reference frequency signal remaining in the reference frequency signal after performing compensation in the digitally-controlled oscillator.

2. The apparatus of claim 1, wherein the local oscillator to utilize a phase-locked loop to generate the output signal.

3. The apparatus of claim 2, wherein the local oscillator to provide the output as a local oscillation signal to a radio frequency (RF) stage of a communication device.

4. The apparatus of claim 2, wherein the local oscillator to provide the output as a local oscillation signal to a radio frequency (RF) stage of a mobile phone.

5. The apparatus of claim 2, wherein the local oscillator to provide the output to generate clock signals to a digital stage of a communication device.

6. The apparatus of claim 2, wherein the local oscillator to provide the output to generate clock signals to a digital stage of a mobile phone.

7. The apparatus of claim 1, wherein the first compensation signal is applied to the capacitor array to control the switching in and out capacitors of the capacitor array.

8. The apparatus of claim 7, wherein the first and second compensation signals are utilized to compensate for overlap or discontinuity of the reference frequency signal caused by switching the capacitor array.

9. An apparatus comprising:
a digitally-controlled crystal oscillator (DCXO) to generate a reference frequency signal, the DCXO including a capacitor array configured to adjust the reference frequency signal by switching in and out capacitors of the capacitor array to compensate for drift in the reference frequency signal;
a phase-locked loop (PLL) coupled to receive the reference frequency signal and to provide an output signal based on the reference frequency signal; and
a frequency correction module, coupled to the DCXO and the PLL, to provide a first compensation signal to the capacitor array to compensate for drift of the reference frequency signal by selecting capacitors of the capacitor array, in which the first compensation signal also to adjust for overlap or discontinuity of the reference frequency signal caused by switching capacitors in the capacitor array, the frequency correction module to also provide a second compensation signal to the PLL to adjust for variations of the reference frequency signal remaining in the reference frequency signal after performing compensation for the DCXO in the capacitor array.

10. The apparatus of claim 9, wherein the PLL to provide the output signal as a local oscillation signal to a radio frequency (RF) receiver of a communication device.

11. The apparatus of claim 9, wherein the local oscillator to provide the output signal to generate clock signals to a digital stage of a communication device.

12. The apparatus of claim 10, further including a baseband module to provide baseband processing for the communication device, wherein the frequency correction module is part of the baseband module.

13. The apparatus of claim 12, wherein the output signal from the PLL is also coupled as a reference input to a second PLL, in which the second PLL to provide a transmit local oscillation signal to a radio frequency (RF) transmitter of the communication device.

14. The apparatus of claim 13, wherein the communication device is a mobile phone.

15. The apparatus of claim 9, wherein the capacitor array includes a coarse adjustment capacitor array and a fine adjustment capacitor array to coarse adjust and fine adjust the DCXO.

16. The apparatus of claim 15, wherein the first compensation signal adjusts for overlap or discontinuity when switching between the coarse adjustment capacitor array and the fine adjustment capacitor array.

17. A method comprising:
providing a first compensation signal from a frequency correction module to a capacitor array of a digitally-controlled crystal oscillator (DCXO) to compensate for drift of a reference frequency signal generated by the DCXO by selecting capacitors of the capacitor array, in which the first compensation signal also to adjust for overlap or discontinuity of the reference frequency signal caused by switching capacitors in the capacitor array; and providing a second compensation signal from the frequency correction module to a phase-locked loop (PLL) that receives the reference frequency signal from the DCXO to adjust for variations of the reference frequency signal remaining in the reference frequency signal after performing compensation for the DCXO by the capacitor array.

18. The method of claim 17, wherein the first compensation signal provides control words to a digital-to-analog converter that switches the capacitors of the capacitor array.

19. The method of claim 17, wherein the first compensation signal is based on a curve that adjusts for offsets when switching the capacitors in the capacitor array.

20. The method of claim 17, wherein the first compensation signal is based on a curve that adjusts for offsets when switching the capacitors to provide coarse adjustment in the capacitor array.

* * * * *